United States Patent
Liu et al.

(10) Patent No.: US 10,979,143 B2
(45) Date of Patent: Apr. 13, 2021

(54) FREQUENCY CHIRP CORRECTION METHOD FOR PHOTONIC TIME-STRETCH SYSTEM

(71) Applicant: Zhejiang University, Hangzhou (CN)

(72) Inventors: Changqiao Liu, Hangzhou (CN); Xiaofeng Jin, Hangzhou (CN); Xianbin Yu, Hangzhou (CN); Xiangdong Jin, Hangzhou (CN); Xianmin Zhang, Hangzhou (CN); Shilie Zheng, Hangzhou (CN); Qinggui Tan, Hangzhou (CN); Bo Cong, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 16/789,431

(22) Filed: Feb. 13, 2020

(65) Prior Publication Data

US 2020/0274616 A1 Aug. 27, 2020

(30) Foreign Application Priority Data

Feb. 26, 2019 (CN) .......................... 201910142366.5

(51) Int. Cl.
| | |
|---|---|
| *H04B 10/2513* | (2013.01) |
| *H04B 10/2543* | (2013.01) |
| *H01S 3/067* | (2006.01) |
| *H01S 5/065* | (2006.01) |
| *H01S 3/00* | (2006.01) |
| *H04B 10/2507* | (2013.01) |

(52) U.S. Cl.
CPC ..... *H04B 10/25133* (2013.01); *H01S 3/0057* (2013.01); *H01S 3/06725* (2013.01); *H01S 5/0657* (2013.01); *H04B 10/2507* (2013.01); *H04B 10/2513* (2013.01); *H04B 10/2543* (2013.01)

(58) Field of Classification Search
None
See application file for complete search history.

(56) References Cited

U.S. PATENT DOCUMENTS

| | | | | |
|---|---|---|---|---|
| 8,930,430 | B2* | 1/2015 | Stojanovic | H04B 10/25133 708/300 |
| 10,128,959 | B1* | 11/2018 | Hueda | H04L 7/0075 |
| 10,887,022 | B2* | 1/2021 | Dar | H04B 10/60 |
| 2002/0063923 | A1* | 5/2002 | Coppeta | G02B 6/4215 398/34 |
| 2009/0148164 | A1* | 6/2009 | Roberts | H04B 10/2572 398/65 |

(Continued)

*Primary Examiner* — Jai M Lee

(57) ABSTRACT

A frequency chirp correction method for the photonic time-stretch system comprises acquiring the stretching signal, i.e. acquiring the time-domain data after the time-domain stretching. First, the time-domain data of the stretching signal is Fourier transformed to obtain the spectral distribution. The spectral distribution is then convoluted with the first frequency-domain correction factor, and then multiplied with the second frequency-domain correction factor to obtain the modified frequency spectrum. Finally, the modified frequency spectrum is performed by the inverse Fourier transform to obtain the time-domain signal after the frequency chirp correction.

13 Claims, 5 Drawing Sheets

(56) References Cited

U.S. PATENT DOCUMENTS

| | | | |
|---|---|---|---|
| 2010/0092181 A1* | 4/2010 | Roberts | H04B 10/6161 398/159 |
| 2010/0329697 A1* | 12/2010 | Koizumi | H04L 27/223 398/208 |
| 2011/0064421 A1* | 3/2011 | Zhang | H04B 10/6161 398/208 |
| 2012/0033965 A1* | 2/2012 | Zhang | H04B 10/65 398/38 |
| 2012/0096061 A1* | 4/2012 | Hauske | H04B 10/2507 708/319 |
| 2012/0114341 A1* | 5/2012 | Hu | H04B 10/6162 398/208 |
| 2013/0216240 A1* | 8/2013 | Fukuchi | H04B 10/6161 398/208 |
| 2013/0315607 A1* | 11/2013 | Sadot | H04B 10/612 398/159 |
| 2018/0019814 A1* | 1/2018 | Fludger | H04B 10/0799 |

* cited by examiner

FREQUENCY CHIRP CORRECTION METHOD FOR PHOTONIC TIME-STRETCH SYSTEM

CROSS REFERENCE OF RELATED APPLICATIONS

The present application claims the benefit of China Patent Application No. 201910142366.5, entitled "FREQUENCY CHIRP CORRECTION METHOD FOR PHOTONIC TIME-STRETCH SYSTEM" filed on Feb. 26, 2019, in the China National Intellectual Property Administration, the entire content of which is incorporated herein in its entirety.

TECHNICAL FIELD

The present disclosure relates to a technical filed of the photoelectricity, in particular to a frequency chirp correction method for a photonic time-stretch system.

BACKGROUND

High speed analog-to-digital converters have broad application prospects in broadband communication, radar, electronic countermeasures and other fields. With the continuous improvement of processing signal bandwidth, the performance of analog-to-digital converter also has higher requirements. But in the high frequency range, due to the limitation of the timing jitter of electronic devices and the uncertainty of comparator, a sampling rate of electronic analog-to-digital converter (ADC) over 20GS/s is difficult to achieve, which to some extent becomes the bottleneck of the development of ultra-wideband technology. In order to overcome the limitation of electronic constraints on analog-to-digital converter performance, many photonic ADC technologies have been proposed. Compared with traditional electronic ADC, photonic ADC has a higher sampling rate and has the performance of anti-electromagnetic interference and radiation resistance. Among many solutions of photonic ADC, the photonic time-stretch ADC has been widely concerned. The technique of photonic time stretch utilizes the group velocity dispersion effect in the dispersion link to broaden the modulated pulse optical signal, thus reducing the frequency of the modulated RF signal on the optical pulse, thereby reducing the sampling rate requirement of the ADC.

The structure of the photonic time-stretch system is shown in FIG. 1. The working process of the system is that the mode locked laser 1 generates the ultrashort pulse laser, filtering out the appropriate wave band by the optical filter 2, and then the appropriate wave band passes through the first optical fiber 3. Due to the dispersion effect, the chirped optical pulse is obtained. The chirped optical pulse passes through the M-Z electro-optical modulator 5, and modulates the microwave signal 4 on the envelope of chirped optical pulse in the way of single arm double-sideband modulation to output the optical carried microwave signal. The optical carried microwave signal passes through the second optical fiber 6, due to the dispersion effect, it is further stretched in the time-domain. The stretched optical carried microwave signal is then photoelectric converted and quantification sampled by photodetector 7 and analog-to-digital converter 8 to obtain the digital stretching signal. The existing theoretical models of photonic time-stretch system are mostly analyzed and set up based on the linear group velocity dispersion of optical fiber. The linear dispersion will bring the problem of power periodic fading to the photonic time-stretch system. The nonlinear group velocity dispersion of optical fiber is related to the transmission wavelength, and the wavelength range of the light source is wide in the photonic time-stretch system. Therefore, in the actual system application, different time segments in the same pulse period may stretch different multiples due to the nonlinear dispersion, so that the frequency chirp of the output signal occurs.

The frequency chirp of the output signal of the photonic time-stretch system will reduce the effective bits of the ADC assisted by the photonic time-stretch system, generate carrier detection error and affect the accurate demodulation of the output broadband communication signal of the photonic time-stretch system. The existing photonic time-stretch system model does not analyze the frequency chirp of the output signal caused by the nonlinear dispersion, at the same time, there is also a lack of methods to correct this problem.

SUMMARY

In view of the above, the present disclosure is to provide a frequency chirp correction method for a photonic time-stretch system to solve the problem of frequency chirp of output signal caused by nonlinear dispersion in the prior art.

A frequency chirp correction method for a photonic time-stretch system, includes the following steps:

(1) acquiring a photocurrent signal outputted by the photonic time-stretch system;

(2) transforming the photocurrent signal from a time-domain to a frequency-domain representation by Fourier transform, to obtain a frequency spectrum signal correspondingly;

(3) applying two frequency-domain correction factors $H_1(\omega)$ and $H_2(\omega)$ to modify the frequency spectrum signal;

(4) performing the inverse Fourier transform on the modified frequency spectrum signal to obtain a photocurrent signal in time-domain representation after the frequency chirp correction.

Further, the expression of the photocurrent signal in step (1) is as follows:

$$I(t) = \frac{A}{2}\left\{\exp\left[j\frac{\omega_{RF}t}{M(t)}\right] + \exp\left[-j\frac{\omega_{RF}t}{M(t)}\right]\right\}$$

wherein, A and $\omega_{RF}$ represent the amplitude and angular frequency of the microwave signal inputted by the system, respectively; j represents the imaginary unit; l(t) represents the photocurrent signal, t represents the time, and M(t) represents the time-domain stretch multiple of the system related to time.

Further, the process of modifying the frequency signal in the step (3) is: firstly, performing convolution on the frequency spectrum signal with the frequency-domain correction factor $H_1(\omega)$, and then multiplying the convolution result with the frequency-domain correction factor $H_2(\omega)$ to obtain the modified frequency spectrum signal.

Further, the expression of the corrected photocurrent signal in step (4) is as follows:

$$I'(t) = A\cos\left(\frac{\omega_{RF}t}{M}\right)$$

wherein A and $\omega_{RF}$ represent the amplitude and angular frequency of the microwave signal inputted by the system, respectively; t represents the time; M represents the time-domain stretch multiple when the system only considers linear dispersion, and I'(t) represents the photocurrent signal after frequency chirp correction.

Further, the expression of the frequency-domain correction factor $H_1(\omega)$ is as follows:

$$H_1(\omega) = \exp\left(-\frac{\omega^2}{2\omega_d^2}\right) \cdot [\tau_1(\omega)L_1 + \tau_2(\omega)L_2]$$

wherein, $\omega$ represents the angular frequency, $\omega_d$ represents the frequency width filtered by the optical filter in the system, $L_1$ is the length of the first optical fiber in the system, $\tau_1(\omega)$ is the group delay per unit length corresponding to the first optical fiber under the angular frequency $\omega$, $L_2$ is the length of the second optical fiber in the system, $\tau_2(\omega)$ is the group delay per unit length corresponding to the second optical fiber under the angular frequency $\omega$.

Further, the expression of the frequency-domain correction factor $H_2(\omega)$ is as follows:

$$H_2(\omega) = (M-1) \cdot \tau_1(\omega)L_1 - \tau_2(\omega)L_2$$

wherein $\omega$ is the angular frequency, M is the time-domain stretch multiple when the system only considers linear dispersion, $L_1$ is the length of the first optical fiber in the system, $\tau_1(\omega)$ is the group delay per unit length corresponding to the first optical fiber under the angular frequency $\omega$, $L_2$ s the length of the second optical fiber in the system, $\tau_2(\omega)$ is the group delay per unit length corresponding to the second optical fiber under the angular frequency $\omega$.

Further, the expression of the time-domain stretch multiple M is as follows:

$$M = \frac{\beta_1 L_1 + \beta_2 L_2}{\beta_1 L_1}$$

wherein $\beta_1$ represents the second-order dispersion coefficient of the first optical fiber in the system, $\beta_2$ represents the second-order dispersion coefficient of the second optical fiber in the system, $L_1$ is the length of the first optical fiber in the system, $L_2$ is the length of the second optical fiber in the system.

The advantageous technical effect of the present disclosure is that the signal frequency converted by the photonic time-stretch system will no longer change with time, so as to realize the accurate signal detection, at the same time, the output signal-to-noise ratio of the system is improved, which is conducive to the subsequent signal demodulation.

DETAILED DESCRIPTION OF THE EMBODIMENTS

In order to describe the present disclosure more specifically, the technical solution of the present disclosure will be described in detail below in combination with the drawings and the specific embodiments.

Figure 1:
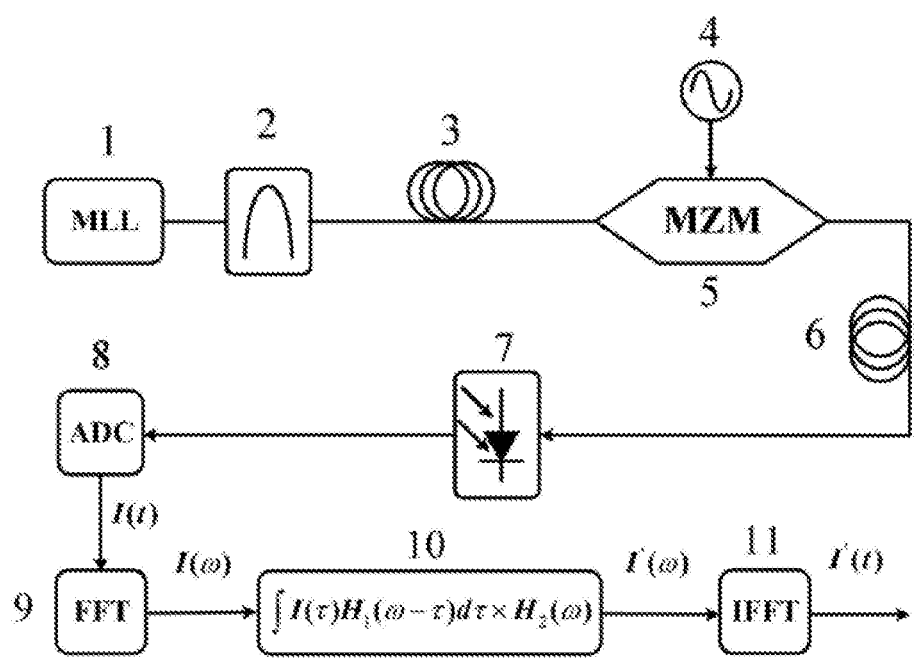
FIG. 1 is a structural block diagram of a photonic time-stretch system and a correction system of the present disclosure.

The present disclosure is to provide a frequency chirp correction method for a photonic time-stretch system, including the following steps:

(1) The time-domain electrical signal output by the photonic time-stretch system is acquired, wherein the specific process of the time-domain electrical signal output by the photonic time-stretch system is as follows:

1.1. As shown in FIG. 1, the mode locked laser 1 generates ultrashort pulse laser, filtering out the appropriate wave band by the optical filter 2, and then the appropriate wave band passes through the first optical fiber 3. Due to the dispersion effect, the chirped optical pulse is obtained. The pulse broadening width is:

$$\Delta t_1(\omega) = L_1 \cdot \tau_1(\omega)$$

wherein, $\omega$ represents the angular frequency, $L_1$ is the length of the first optical fiber $L_1$, $\tau_1(\omega)$ is the group delay per unit length corresponding to the first optical fiber under the angular frequency $\omega$, and $\Delta t_1(w)$ is the pulse broadening width after passing through the first optical fiber under the angular frequency $\omega$.

1.2. The chirped optical pulse passes through the M-Z electro-optical modulator 5, and modulates the microwave signal 4 on the envelope of the chirped optical pulse in the way of single arm double-sideband modulation to output the optical carried microwave signal.

1.3. The optical carried microwave signal passes through the second optical fiber 6, due to the dispersion effect, it is further stretched in the time-domain. And the pulse broadening width is:

$$\Delta t_t(\omega) = L_1 \cdot \tau_1(\omega) + L_2 \cdot \tau_2(\omega)$$

wherein, $\omega$ is the angular frequency, $L_1$ is the length of the first optical fiber $L_1$, $\tau_1(\omega)$ is the group delay per unit length corresponding to the first optical fiber under the angular frequency $\omega$, $L_2$ is the length of the second optical fiber $L_2$, $\tau_2(\omega)$ is the group delay per unit length corresponding to the second optical fiber under the angular frequency $\omega$, $\Delta t_2(\omega)$ is the pulse broadening width after passing through two optical fibers under the angular frequency $\omega$.

The stretch multiple of the system is:

$$M(t) = \frac{\Delta t_2(\omega)|_{\omega = \frac{t}{\Phi}}}{\Delta t_1(\omega)|_{\omega = \frac{t}{\Phi}}}$$

Wherein, t represents the time, $\Delta t_1(\omega)$ represents the pulse broadening width after passing through the first optical fiber at the angular frequency $\omega$, $\Delta t_t(\omega)$ represents the pulse broadening width after passing through the two optical fibers at the angular frequency $\omega$, $\Phi = \beta_1 L_1 + \beta_2 L_2$ is the total second-order dispersion of the two optical fibers, $\beta_1$ is the second-order dispersion coefficient of the first optical fiber, $\beta_2$ is the second-order dispersion coefficient of the second optical fiber, $\omega$ is the angular frequency, and $L_1$ is the second-order dispersion coefficient of the first optical fiber $L_1$, $L_2$ is the length of the second optical fiber $L_2$, and M(t) is the time-domain stretch multiple related to time.

If only considering the linear dispersion, the stretch multiple of the system is constant:

$$M = \frac{\beta_1 L_1 + \beta_2 L_2}{\beta_1 L_1}$$

wherein: $\beta_1$ is the second-order dispersion coefficient of the first optical fiber, $\beta_2$ is the second-order dispersion coefficient of the second optical fiber, $L_1$ is the length of the first optical fiber $L_1$, and $L_2$ is the length of the second optical fiber $L_2$. M is a constant time-domain stretch multiple only considering the linear dispersion.

1.4. The stretched optical carried microwave signal is then photoelectric converted and quantification sampled by the photodetector 7 and the analog-to-digital converter 8 to obtain the digital stretching signal. When the system inputs a single tone signal, under the condition of the small signal approximation (m<<1), the output current time-domain signal is:

$$I(t) = i_{env}(t)[-4J_1(m)\cos\varphi_{disp} - 2J_1(2m\sin\varphi_{disp})]\cos\left[\frac{\omega_{RF}t}{M(t)}\right]$$

$$\approx i_{env}(t)[-2\sqrt{2}\,m\cos(\varphi_{disp} - \frac{\pi}{4})]\cos\left[\frac{\omega_{RF}t}{M(t)}\right]$$

$$= \frac{A}{2}\left\{\exp\left[j\frac{\omega_{RF}t}{M(t)}\right] + \exp\left[-j\frac{\omega_{RF}t}{M(t)}\right]\right\}$$

Wherein, $i_{env}(t)$ represents the pulse envelope of the stretched microwave signal, $J_n(x)$ represents the first kind of Bessel function of order n, $\varphi_{disp}$ represents the phase complex constant introduced by dispersion, $\omega_{RF}$ represents the angular frequency of the input microwave signal, t represents the time, M(t) represents the time-domain stretch multiple related to time, A represents the amplitude of the microwave signal, j represents the imaginary unit, and I(t) represents the photocurrent outputted by the detector.

It can be seen that the photonic time-stretch system changes the frequency of microwave signal to 1/M(t), and the problem of frequency chirp occurs in the microwave signal.

(2) The time-domain signal is transformed into the frequency-domain signal through the Fourier transform (FFT) 9, which is expressed as:

$$I(\omega) = \pi A\left\{\delta\left[\omega - \frac{\omega_{RF}}{M(t)|_{t=\omega\Phi}}\right] + \delta\left[\omega + \frac{\omega_{RF}}{M(t)|_{t=\omega\Phi}}\right]\right\}$$

Wherein, $\omega$ represents angular frequency; A and $\omega_{RF}$ represent amplitude and angular frequency of microwave signal, respectively; $\delta[\ ]$ is Dirac delta function, t represents time, M(t) is the time-domain stretch multiple related to time; $\Phi = \beta_1 L_1 + \beta_2 L_2$ is the total second-order dispersion of two optical fibers, $\beta_1$ is the second-order dispersion coefficient of the first optical fiber, $\beta_2$ is the second-order dispersion coefficient of the second optical fiber, $\omega$ is the angular frequency; $L_1$ is the length of the first optical fiber $L_1$, $L_2$ is the length of the second optical fiber $L_2$, and I(w) is the frequency-domain expression of the digitized signal.

(3) The spectrum is convoluted with the first frequency-domain correction factor $$H_1(\omega) = \exp\left(-\frac{\omega^2}{2\omega_d^2}\right)\cdot[\tau_1(\omega)L + \tau_2(\omega)L_2],$$

and then multiplied with the second frequency-domain correction factor $H_2(\omega) = (M-1)\cdot\tau_1(\omega)L_1 - \tau_2(\omega)L_2$. The corrected spectrum is obtained as follows:

$$I(\omega) = \int I(\tau)H_1(\omega - \tau)d\tau \times H_2(\omega)$$

$$= \sum_n \pi A_n\left\{\delta\left[\omega - \frac{\omega_{RFn}}{M}\right] + \delta\left[\omega + \frac{\omega_{RFn}}{M}\right]\right\}$$

Wherein, $\omega$ represents the angular frequency, $H_1(\omega)$ represents the first frequency-domain correction factor; $H_2(\omega)$ represents the second frequency-domain correction factor; A and $\omega_{RF}$ represent the amplitude and angular frequency of microwave signal, respectively; $\delta[\ ]$ represents the Dirac delta function; M represents a constant time-domain stretch multiple only considering the linear dispersion; and I'($\omega$) is the modified spectrum formula.

(4) The inverse Fourier transform (IFFT)11 is performed on the modified frequency spectrum to obtain a time-domain signal after the frequency chirp correction.

$$I'(t) = \frac{A}{2}\left\{\exp\left(j\frac{\omega_{RF}t}{M(t)}\right) + \exp\left(-j\frac{\omega_{RF}t}{M(t)}\right)\right\}$$

$$= A\cos\left(\frac{\omega_{RF}t}{M}\right)$$

wherein A and $\omega_{RF}$ represent the amplitude and angular frequency of the microwave signal, respectively; t represents the time; M represents the time-domain stretch multiple when the system only considers linear dispersion, J is the imaginary unit, and I'(t) represents the time-domain signal without frequency chirp.

It can be seen that the output signal that modified by frequency chirp correction no longer changes in frequency with time, and a stable M times frequency reduction is achieved.

In the following, the effectiveness of the technical solution of the present disclosure will be further verified through simulation results specifically: the center frequency of ultrashort pulse laser is 193.41 THz, and the frequency band from 192.17 THz to 194.67 THz is filtered out by optical filter. The pulse laser is broadened through the first optical fiber with a length of 3 km, wherein the second-order dispersion coefficient of the first optical fiber is 16.44 ps/nm/km, and the group delay per unit length of the first optical fiber under the angular frequency co is $$\tau_1(\omega) = (\omega + 4\times 10^{11})\left[\frac{36\pi^2}{\omega \times 10^5} - \frac{1496^4\omega^3}{9\pi^2 \times 10^{51}(\omega + 2\times 10^{11})^2}\right].$$

The microwave signal passes through the Mach-Zehnder modulator to be modulated on the broadened pulse laser in a way of double-sideband intensity modulation. The modulated pulse laser then passes through the second optical fiber with a length of 9 km to realize optical time stretching, wherein the second-order dispersion coefficient of the second optical fiber is 16.44 ps/nm/km, and the group delay per unit length of the second optical fiber under the angular frequency ω is $$\tau_2 = (\omega + 4 \times 10^{11}) \left[ \frac{198\pi^2}{\omega \times 10^6} - \frac{11 \times 1312^4 \omega^3}{18\pi^2 \times 10^{52}(\omega + 2 \times 10^{11})^2} \right].$$

Then, the stretched pulse laser is then photoelectric converted and quantification sampled by photodetector and analog-to-digital converter to obtain the digital time-domain electrical signal. And the time-domain electrical signal is Fourier transformed to obtain the frequency-domain representation. Next, the frequency spectrum is convoluted with the first frequency-domain correction factor, and the convolution result is multiplied with the second frequency-domain correction factor to obtain the modified frequency spectrum. Finally, the modified frequency spectrum is performed inverse Fourier transformed to obtain the modified time-domain signal after the frequency chirped correction.

Figure 2:
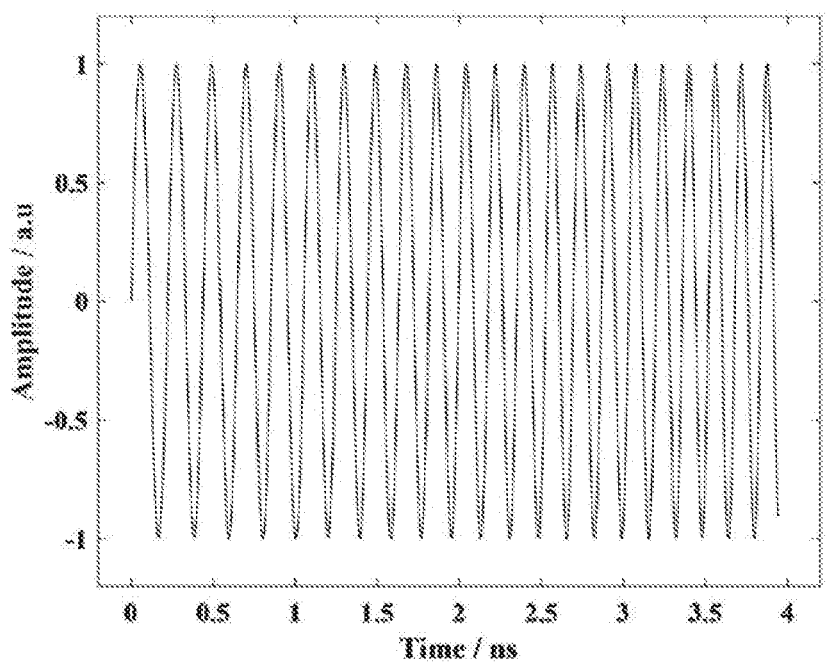
FIG. 2 is a time-domain waveform of the output signal of the photonic time-stretch system.
Figure 3:
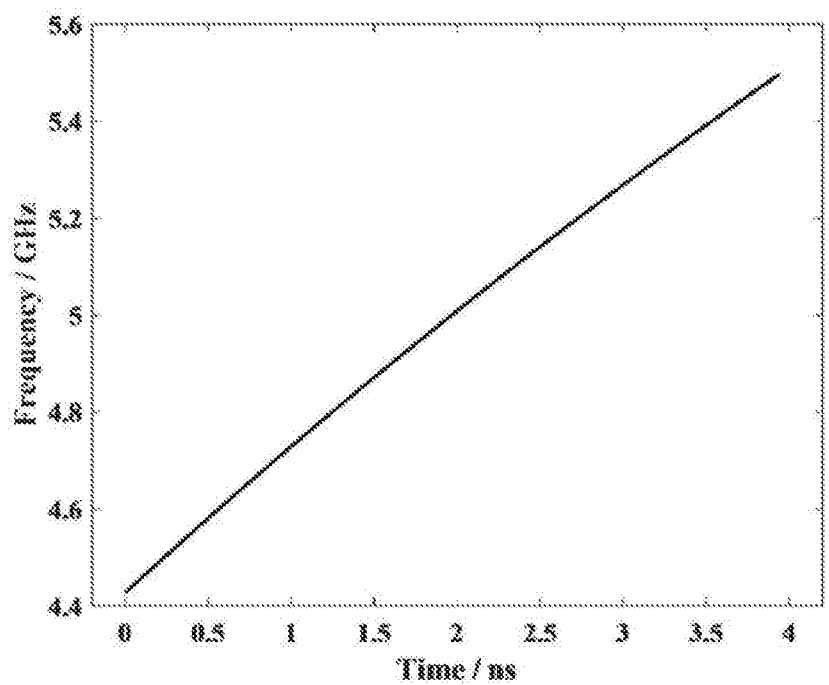
FIG. 3 is a graph showing the frequency of the output signal of the photonic time-stretch system changing with time.
Figure 4:
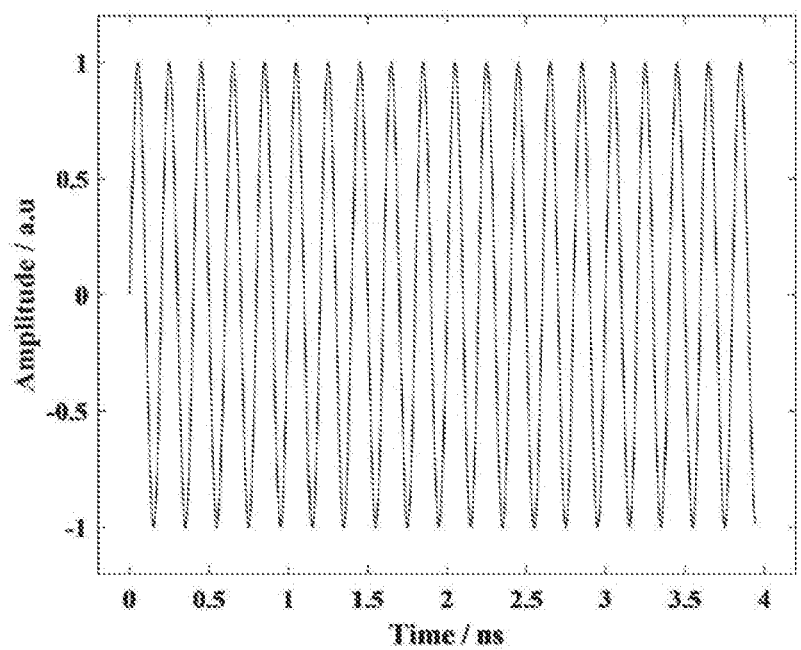
FIG. 4 is a time-domain waveform of the output signal after the frequency chirp correction by the present disclosure.
Figure 5:
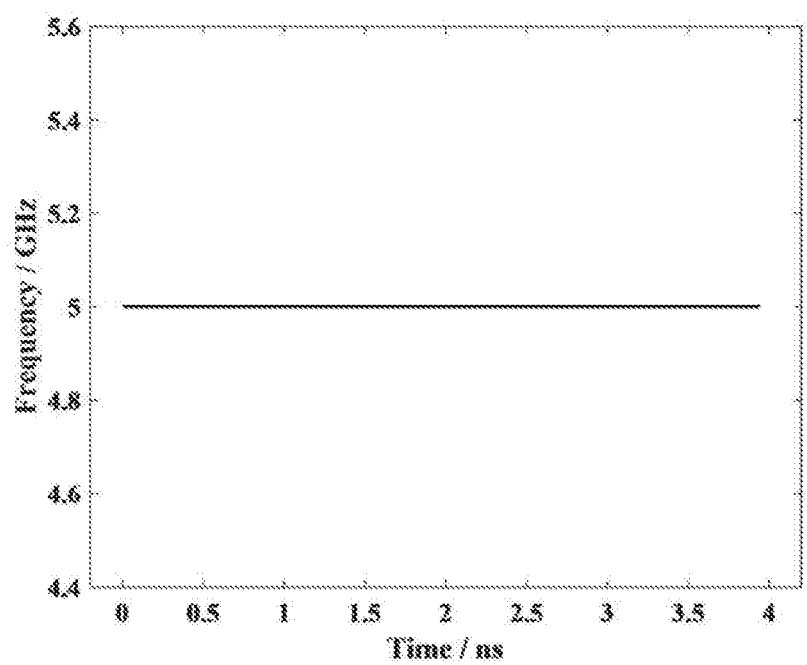
FIG. 5 is a graph showing the frequency of the output signal changing with time after the frequency chirp correction by the present disclosure.

In the simulation example, the input microwave signal is a sine wave signal with a frequency of 20 GHz, and the modulation coefficient is 0.1. FIG. 2 and FIG. 3 are the time-domain waveform of the output signal of the photonic time-stretch system and the curve of the frequency of the output signal of the photonic time-stretch system changing with time, respectively. It can be seen from FIG. 2 that the output signal of the system is not a sine wave signal with stable frequency, and FIG. 3 more intuitively shows that the frequency of the output signal is changing with the time from about 4.4 GHz to about 5.5 GHz. FIG. 4 is a time-domain waveform of the output signal after the frequency chirp correction by the present disclosure, and FIG. 5 is a graph showing the frequency of the output signal changing with time after the frequency chirp correction by the present disclosure. It can be seen from FIG. 4 and FIG. 5 that the frequency of the signal outputted by the system is stable at 5 GHz when inputting 20 GHz sinusoidal signal, and the stretching ratio is fixed at 4 without any change with time. Compared with FIG. 2 and FIG. 3, the method of the present disclosure can effectively correct the problem of the frequency chirp of the output signal in the photonic time-stretch system.

The above described embodiments are for the convenience of those skilled in the art to understand and apply the present disclosure. It is obvious that those skilled in the art can easily make various modifications to the above embodiments, and apply the general principles described herein to other embodiments without creative labor. Therefore, the present disclosure is not limited to the above embodiments. According to the disclosure of the present disclosure, the improvement and modification of the present disclosure should be within the scope of the present disclosure.

What is claimed is:

1. A frequency chirp correction method for a photonic time-stretch system, comprising:
   (1) acquiring a photocurrent signal by an analog to digital converter outputted by a fiber;
   (2) transforming the photocurrent signal from a time-domain to a frequency-domain representation through Fourier transform, to obtain a frequency spectrum signal;
   (3) applying two frequency-domain correction factors $H_1$ (ω) and $H_2$ (ω) to modify the frequency spectrum signal;
   (4) performing the inverse Fourier transform on the modified frequency spectrum signal to obtain a photocurrent signal in time-domain representation after the frequency chirp corrections;
   wherein an expression of the frequency-domain correction factor $H_1$ (ω) is as follows:

$$H_1(\omega) = \exp\left(-\frac{\omega^2}{2\omega_d^2}\right) \cdot [\tau_1(\omega)L_1 + \tau_2(\omega)L_2]$$

wherein, ω represents an angular frequency, $\omega_d$ represents a frequency width filtered by an optical filter in the system, $L_1$ is a length of a first optical fiber in the system, $\tau_1$ (w) is a group delay per unit length corresponding to the first optical fiber under the angular frequency ω, $L_2$ is a length of a second optical fiber in the system, and $\tau_2$ (ω) is a group delay per unit length corresponding to the second optical fiber under the angular frequency ω.

2. The frequency chirp correction method according to claim 1, wherein the expression of the photocurrent signal in step (1) is as follows:

$$I(t) = \frac{A}{2}\left\{\exp\left[j\frac{\omega_{RF}t}{M(t)}\right] + \exp\left[-j\frac{\omega_{RF}t}{M(t)}\right]\right\}$$

wherein, A and $\omega_{RF}$ represent an amplitude and angular frequency of a microwave signal inputted by the system, respectively; j represents an imaginary unit; I(t) represents a photocurrent signal, t represents time, and M (t) represents a time-domain stretch multiple of the system related to time.

3. The frequency chirp correction method according to claim 1, wherein the process of modifying the frequency signal in the step (3) is: performing convolution on the frequency spectrum signal with the frequency-domain correction factor $H_1$ (ω), and then multiplying a convolution result with the frequency-domain correction factor $H_2$ (ω) to obtain the modified frequency spectrum signal.

4. The frequency chirp correction method according to claim 1, wherein the expression of the corrected photocurrent signal in step (4) is as follows:

$$I'(t) = A\cos\left(\frac{\omega_{RF}t}{M}\right)$$

wherein A and $\omega_{RF}$ represent an amplitude and angular frequency of a microwave signal inputted by the system, respectively; t represents time; M represents a time-domain stretch multiple when the system only considers linear dispersion, and I' (t) represents a photocurrent signal after frequency chirp correction.

5. The frequency chirp correction method according to claim 1, wherein an expression of the frequency-domain correction factor $H_2$ (ω) is as follows:

$$H_2(\omega) = (M-1) \cdot \tau_1(\omega)L_1 - \tau_2(\omega)L_2$$

wherein ω is the angular frequency, M is the time-domain stretch multiple when the system only considers linear dispersion, $L_1$ is the length of the first optical fiber in the system, $\tau_1$ (ω) is the group delay per unit length corresponding to the first optical fiber under the angular frequency ω, $L_2$ is the length of the second optical fiber in the system, and $\tau_2$ (ω) is the group delay per unit length corresponding to the second optical fiber under the angular frequency ω.

6. The frequency chirp correction method according to claim 4,
wherein an expression of the time-domain stretch multiple M is as follows:

$$M = \frac{\beta_1 L_1 + \beta_2 L_2}{\beta_1 L_1}$$

wherein $\beta_1$ represents a second-order dispersion coefficient of the first optical fiber in the system, $\beta_2$ represents a second-order dispersion coefficient of the second optical fiber in the system, $L_1$ is the length of the first optical fiber in the system, and $L_2$ is the length of the second optical fiber in the system.

7. The frequency chirp correction method according to claim 5, wherein the expression of the time-domain stretch multiple M is as follows:

$$M = \frac{\beta_1 L_1 + \beta_2 L_2}{\beta_1 L_1}$$

wherein $\beta_1$ represents a second-order dispersion coefficient of the first optical fiber in the system, $\beta_2$ represents a second-order dispersion coefficient of the second optical fiber in the system, $L_1$ is the length of the first optical fiber in the system, and $L_2$ is the length of the second optical fiber in the system.

8. A frequency chirp correction method for a photonic time-stretch system, comprising:
(1) acquiring a photocurrent signal by an analog to digital converter outputted by a fiber;
(2) transforming the photocurrent signal from a time-domain to a frequency-domain representation through Fourier transform, to obtain a frequency spectrum signal;
(3) applying two frequency-domain correction factors $H_1$ (ω) and $H^2$ (ω) to modify the frequency spectrum signal;
(4) performing the inverse Fourier transform on the modified frequency spectrum signal to obtain a photocurrent signal in time-domain representation after the frequency chirp correction;
wherein an expression of the frequency-domain correction factor $H_2$ (ω) is as follows:

$$H_2(\omega) = (M-1) \cdot \tau_1(\omega)L_1 - \tau_2(\omega)L_2$$

wherein ω is an angular frequency, M is a time-domain stretch multiple when the system only considers linear dispersion, $L_1$ is a length of the first optical fiber in the system, $\tau_1$ (ω) is a group delay per unit length corresponding to the first optical fiber under the angular frequency ω, $L_2$ is a length of the second optical fiber in the system, and $\tau_2$ (ω) is a group delay per unit length corresponding to the second optical fiber under the angular frequency ω.

9. The frequency chirp correction method according to claim 8, wherein the expression of the photocurrent signal in step (1) is as follows:

$$I(t) = \frac{A}{2}\left\{\exp\left[j\frac{\omega_{RF}t}{M(t)}\right] + \exp\left[-j\frac{\omega_{RF}t}{M(t)}\right]\right\}$$

wherein, A and $\omega_{RF}$ represent an amplitude and angular frequency of a microwave signal inputted by the system, respectively; j represents an imaginary unit; I(t) represents a photocurrent signal, t represents time, and M(t) represents a time-domain stretch multiple of the system related to time.

10. The frequency chirp correction method according to claim 8, wherein the process of modifying the frequency signal in the step (3) is: performing convolution on the frequency spectrum signal with the frequency-domain correction factor $H_1$ (ω), and then multiplying a convolution result with the frequency-domain correction factor $H_2$ (ω) to obtain a modified frequency spectrum signal.

11. The frequency chirp correction method according to claim 8, wherein the expression of the corrected photocurrent signal in step (4) is as follows:

$$I'(t) = A\cos\left(\frac{\omega_{RF}t}{M}\right)$$

wherein A and $\omega_{RF}$ represent an amplitude and angular frequency of a microwave signal inputted by the system, respectively; t represents time; M represents the time-domain stretch multiple when the system only considers linear dispersion, and $1^1$ (t) represents a photocurrent signal after frequency chirp correction.

12. The frequency chirp correction method according to claim 8, wherein an expression of the frequency-domain correction factor $H_1(\omega)$ is as follows:

$$H_1(\omega) = \exp\left(-\frac{\omega^2}{2\omega_d^2}\right) \cdot [\tau_1(\omega)L_1 + \tau_2(\omega)L_2]$$

wherein, ω represents the angular frequency, $\omega_d$ represents a frequency width filtered by an optical filter in the system, $L_1$ is the length of a first optical fiber in the system, $\tau_1$ (ω) is the group delay per unit length corresponding to the first optical fiber under the angular frequency ω, $L_2$ is the length of a second optical fiber in the system, and $\tau_2$ (ω) is the group delay per unit length corresponding to the second optical fiber under the angular frequency ω.

13. The frequency chirp correction method according to claim 11, wherein an expression of the time-domain stretch multiple M is as follows:

$$M = \frac{\beta_1 L_1 + \beta_2 L_2}{\beta_1 L_1}$$

wherein $\beta_1$ represents a second-order dispersion coefficient of the first optical fiber in the system, $\beta_2$ represents a second-order dispersion coefficient of the second optical fiber in the system, $L_1$ is the length of the first optical fiber in the system, and $L_2$ is the length of the second optical fiber in the system.

* * * * *